United States Patent [19]

Swift et al.

[11] Patent Number: 5,281,771
[45] Date of Patent: Jan. 25, 1994

[54] MULTILAYER WIRING BOARD, INTERLEVEL CONNECTOR, AND METHOD FOR MAKING SAME

[75] Inventors: Joseph A. Swift, Ontario; Stanley J. Wallace, Victor, both of N.Y.

[73] Assignee: Xerox Corporation, Stamford, Conn.

[21] Appl. No.: 68,267

[22] Filed: May 28, 1993

Related U.S. Application Data

[63] Continuation of Ser. No. 809,126, Dec. 18, 1991, abandoned.

[51] Int. Cl.⁵ .............................. H05U 1/00
[52] U.S. Cl. ................... 174/262; 174/264; 361/785
[58] Field of Search ............ 174/250, 261, 262, 264; 361/412, 414, 413; 439/66, 86, 91; 428/294, 338, 408, 901

[56] References Cited

U.S. PATENT DOCUMENTS

| | | | |
|---|---|---|---|
| 4,170,677 | 10/1979 | Hutcheson | 439/91 X |
| 4,295,700 | 10/1981 | Sado | 174/262 X |
| 4,358,699 | 11/1982 | Wilsdorf . | |
| 4,408,814 | 10/1983 | Takashi et al. | 439/91 |
| 4,449,774 | 5/1984 | Takashi et al. | 439/91 X |
| 4,584,456 | 4/1986 | Oodaira et al. . | |
| 4,641,949 | 2/1987 | Wallace et al. . | |
| 4,642,889 | 2/1987 | Grabbe | 361/413 X |
| 4,664,971 | 5/1987 | Soens | 428/294 X |
| 4,694,138 | 9/1987 | Oodaira et al. . | |
| 4,841,099 | 6/1989 | Epstein et al. . | |
| 4,912,288 | 3/1990 | Atkinson et al. . | |
| 4,967,314 | 10/1990 | Higgins, III . | |
| 4,970,553 | 11/1990 | Orlowski et al. . | |
| 4,988,306 | 1/1991 | Hopfer, III et al. | 439/66 |
| 5,003,693 | 4/1991 | Atkinson et al. . | |

OTHER PUBLICATIONS

*The American Heritage Dictionary, Second College Edition,* Houghton Mifflin Company, 1982, p,. 500.
Maccorquodale, "Button Connectors—Solaerless, Low-Thermal Rise Interconnect For High-Speed Signal Transmission", *Connection Technology,* Jan. 1990, pp. 25-28.

*Primary Examiner*—Leo P. Picard
*Assistant Examiner*—Cheryl R. Figlin
*Attorney, Agent, or Firm*—Oliff & Berridge

[57] ABSTRACT

An interlevel connector, a multilayer wiring board assembly, and method for making the same are presented. The interlevel connector includes a dielectric substrate having a plurality of through holes and a corresponding plurality of pultrusions. Each pultrusion includes a plurality of electrically conductive fibers and an electrically conductive or insulating host material carrying the plurality of fibers, each of the plurality of pultrusions being located in a respective through hole and having fibrillated portions extending from surfaces of the dielectric substrate. The interlevel connector is used in the construction of a multilayer wiring assembly in which first and second wiring boards having respective conductive portions are interconnected. The interlevel connector is located adjacent and between the first and second wiring boards, whereby the fibrillated portions of the pultrusion extending from the surfaces of the dielectric substrate contact the conductive portions of the first and second wiring boards. The wiring boards can be permanently or removably locatable adjacent the dielectric substrate.

45 Claims, 1 Drawing Sheet

MULTILAYER WIRING BOARD, INTERLEVEL CONNECTOR, AND METHOD FOR MAKING SAME

This is a continuation of application Ser. No. 07/809,126 filed Dec. 18, 1991, now abandoned.

CROSS REFERENCE TO RELATED APPLICATIONS

Attention is directed to: 1) U.S. patent application Ser. No. 07/272,280 filed Nov. 17, 1988 by Swift et al, and a continuation-in-part thereof entitled "Pultruded Electronic Device", U.S. Ser. No. 07/806,061 filed Dec. 11, 1991; and 2) U.S. patent application Ser. No. 07/516,000 filed Apr. 16, 1990 by Orlowski et al, and a continuation-in-part thereof entitled "Fibrillated Pultruded Electronic Component". U.S. Ser. No. 07/806,062 filed Dec. 11, 1991; the disclosures of all of which are herein incorporated by reference.

BACKGROUND OF THE INVENTION

1. Field of the Invention

This invention pertains to improvements in multilayer printed circuit or wiring boards, and, more particularly, to improvements in interconnections between multilayer printed circuits or wiring boards or the like, and to methods for making same.

2. References

"Button Connectors-Solderless, Low-Thermal Rise Interconnect For High-Speed Signal Transmission", MacCorquodale, *Connection Technology*, January, 1990, pp. 25-28, shows a button connecter for interconnection between multilayer printed circuit boards. The button connector is essentially a wad of crumpled wire, the cylindrical button being a mass of fine, springy, highly conductive wire that is fitted into a substrate through-hole by compression, thus limiting the necessity of solder. The dielectric substrate boards, loaded with the buttons, are placed between the circuit boards or components to be interconnected and clamped together.

U.S. Pat. No. 4,967,314 to Huggins, III shows the construction of a circuit board. A high density multilevel printed wiring board is disclosed having interlevel electrical connections made by via interconnect holes which are drilled or punched through only those layers of the wiring board that separate the two layers containing the conductors which are to be connected. The holes are filled with a low-resistance silver-filled conductive epoxy.

U.S. Pat. No. 4,584,456 to Oodaira et al. shows a method for producing a resistor from insulating material by local heating. The resistor is formed by locally heating a layer of insulating material between conductors to convert the heated material into a first resistor element. A second resistor element is formed to contact the first resistor element while measuring the resistance between the conductors, until a desired resistor composed of the first and second resistor element and having a predetermined resistance value is obtained.

U.S. Pat. No. 5,003,693 to Atkinson et al. shows a method for manufacturing electrical circuits within a carrier. The method provides an electrical circuit wherein a carrier, which is a film of insulating plastic material with a circuit pattern thereon, is supported in a mold and a molding material is applied by the application of heat and pressure to provide a substrate having a circuit embedded in or within a three-dimensional surface of the molded substrate.

U.S. Pat. No. 4,694,138 to Oodaira et al. shows a method of forming a conductive path within an insulated composition. The conductive path is formed by providing an insulating substrate having a surface region which is formed of an insulating composition. The insulating composition contains an organic polymeric material and at least one metal source. The surface region of the substrate is selectively heated along a predetermined pattern, thereby decomposing and evaporating the organic polymeric material at the heated portion and welding the metal in the heated portion so as to form a conductor path formed of metal.

U.S. Pat. No. 4,912,288 to Atkinson et al. shows a method of providing an electrical circuit molded within an insulated plastic surface. The method provides an electrical circuit on a surface of a three-dimensional shaped substrate of insulating plastic material, molded by the application of heat and pressure, so that the circuit is embedded in or within a surface of the molded substrate.

U.S. Pat. Nos. 4,841,099 and 4,970,553, to Epstein et al. and Orlowski et al., respectively, both assigned to the assignee of the present application show electrical components having conductive paths. A three-dimensional electrical component, having a first side and a second side formed from an electrically insulating polymer matrix capable of heat conversion to an electrically conducting polymer matrix, has at least one passageway from the first side to the second side having a tapered wall configuration with constantly changing cross-section of the passageway from the first side through the passageway to the second side and an electrically conducting path between the first side and the second side formed by the in situ heat conversion of the walls. The heat conversion of the electrically conductive paths are preferred to be completed by a laser.

SUMMARY OF THE INVENTION

In light of the above, it is, therefore, and object of the invention to provide an improved interconnect for electrically interconnecting different levels of printed circuit, or wiring boards, or the like.

It is another object of the invention to provide and interconnect of the type described that is of relatively low cost compared to currently used interconnect structures.

It is another object of the invention to provide a method for fabricating interconnects for use in multilayer printed circuit and wiring board structures.

It is another object of the invention to provide an improved multilayer printed or wiring board circuit.

It is another object of the invention to provide an interconnect for printed circuit or wiring boards which can be fabricated without the requirement of specialized fabrication equipment or special wire stuffing machinery or the like.

It is another object of the invention to provide an interlevel connector for interconnecting a printed circuit or wiring board, or the like to a substrate manufactured from an electrically insulating polymer matrix which is doped with an electrically insulating fibrous filler capable of heat conversion to an electrically conductive fibrous filler to form the conductors to be interconnected, formed as a wall or similar machine structure.

It is yet another object of the invention to provide an interlevel connector that enables either temporary or permanent interconnection of printed circuit or wiring boards, or the like.

These and other objects, features and advantages will become apparent to those skilled in the art from the following detailed description, when read in conjunction with the accompanying drawings and appended claims.

In accordance with a broad aspect of the invention, an interlevel connector is presented which includes a dielectric substrate having a plurality of through holes and a corresponding plurality of pultrusions. Each pultrusion includes a plurality of electrically conductive fibers and an electrically conductive or insulating host material carrying the plurality of fibers, each of the plurality of pultrusions being located in a respective through hole and having fibrillated portions extending from surfaces of the dielectric substrate.

The interlevel connector is used in the construction of a multilayer wiring assembly in which first and second wiring boards having respective conductive portions are interconnected. The interlevel connector is located adjacent and between the first and second wiring boards, whereby the fibrillated portions of the pultrusion extending from the surfaces of the dielectric substrate contact the conductive portions of the first and second wiring boards. The wiring boards, such as printed circuit boards, printed wiring boards, or devices having conductive connections, can be permanently or removably locatable adjacent the dielectric substrate, and, if desired, the wiring board can comprise a substrate manufactured from an electrically insulating polymer matrix which is doped with an electrically insulating fibrous filler capable of heat conversion to an electrically conductive fibrous filler to form the conductive portion to be interconnected and may serve as a wall or structural member of a machine.

In accordance with another broad aspect of the invention, a method for interconnecting wiring boards in a multilayer wiring assembly is presented. In accordance with the method, a dielectric substrate having top and bottom surfaces is provided, and through holes are formed in the dielectric substrate at desired wiring board interconnection locations. Segments of a pultrusion including a plurality of electrically conductive fibers and a host material carrying the plurality of fibers are located in each of the through holes, the segments being of length sufficient to provide extensions of the pultrusion above and below the top and bottom surfaces of the dielectric substrate. The extensions of the pultrusion are fibrillated, such as by exposing the extensions to a laser beam to remove the host material in the extensions and to affix the segments in place in the through holes, and the wiring boards are fixedly or removably positioned adjacent the top and bottom surfaces of the dielectric substrate.

BRIEF DESCRIPTION OF THE DRAWING

The invention is illustrated in the accompanying drawing in which:

FIG. 3 is an enlarged cut away portion of the printed circuit board or dielectric substrate of FIG. 1, taken at 3—3, and showing the details of a continuous carbon fiber pultrusion configured and placed to form an electrical interconnect between multiple layers of printed circuit boards or printed wiring boards or the like.

Figure 1:
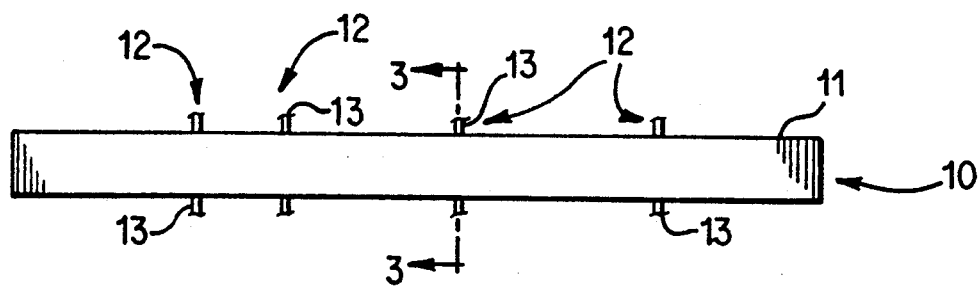
FIG. 1 is a side view of a printed circuit board or dielectric substrate containing carbon fiber pultrusion interconnects, in accordance with a preferred embodiment of the invention.

In the drawings, the figures are not necessarily drawn to scale, and the sizes and the dimensions of the various parts have been exaggerated or distorted for clarity of illustration and ease of description. In addition, in the various figures of the drawing, like reference numerals are used to denote like or similar parts.

DETAILED DESCRIPTION OF THE PREFERRED EMBODIMENTS

In accordance with the present invention, an electronic component is provided and a variety of electronic devices for conducting electrical current such as switches, sensors, etc. are provided which are of greatly improved reliability, are of low cost and easily manufacturable and are capable of reliably operating in low energy circuits. Typically these devices are low energy devices, using low voltages within the range of millivolts to hundreds of volts and currents within the range of microamps to hundreds of milliamps as opposed to power applications of tens to hundreds of amperes, for example. Although the present invention may be used in certain applications in the single amp region it is noted that best results are obtained in high resistance circuitry where power losses can be tolerated. It is also noted that these devices may be used in certain applications in the high voltage region in excess of 10,000 volts, for example, where excessive heat is not generated. These devices are generally electronic in nature within the generic field of electrical devices meaning that their principle applications are in signal level circuits although as previously stated they may be used in certain low power applications where their inherent power losses may be tolerated.

According to the present invention, an electronic component is made from a pultruded composite member having a fibrillated brush-like structure at one end which provides a densely distributed filament contact with another component. By the term densely distributed filament contact it is intended to define an extremely high level of contact redundancy insuring electrical contact with another contact surface in that the contacting component has in excess of 1000 individual conductive fibers per square millimeter.

The invention pertains to interconnects between printed circuit boards (PCB's), printed wiring boards (PWB's), multiple layer wiring boards (MWB's) and the like, such boards being referred to generally herein as printed circuit or wiring boards. In general, a printed circuit board is a flat board or substrate of insulating material, having a front side that may contain sockets or slots for integrated circuit chips, perhaps with connections for a variety of other electronic components, and having electrically conductive pathways to interconnect the components printed on one or both sides.

Boards with conductive pathways on both sides may use plated through holes or eyelets to provide electrical continuity between the sides, and are used in those applications in which the maximum number of interconnections or conductors in a given area are required for minimal cost. Furthermore, in complex circuit arrangements, printed circuit boards are often stacked in interconnected multiple layers, thus capitalizing on the reduced size of miniaturized and microelectronic parts, as the surface area that is required for mounting these subminiature parts and integrated circuit packages has decreased significantly while the number of interconnections has increased many fold.

Figure 4:
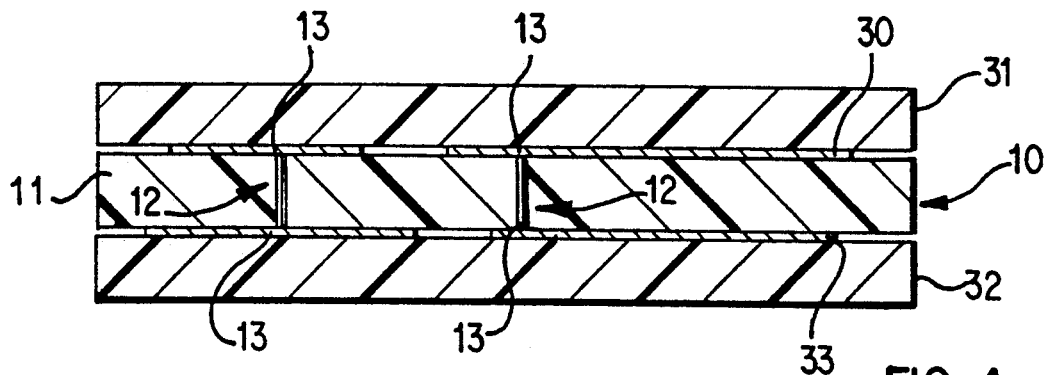
FIG. 4 is a cross-sectional elevation view of a multilayer printed circuit or wiring board structure fabricated using an interlevel connector, in accordance with a preferred embodiment of the invention.

In a typical multilayer printed circuit or wiring board structure, conductors are located on several insulated layers, interconnected in a sandwich structure with one or more interlevel connectors, such interlevel layers being formed upon a dielectric layer or substrate, sometimes referred to as "prepreg". Each of the layers on which conductors are formed are constructed of a number of two sided etched copper foiled (for example) boards, laminated or sandwiched together with the interlevel connector layer under controlled temperature pressure and time. One embodiment of such multilayer structure is shown in FIG. 4, and includes an intermediate dielectric substrate 10 having a pattern of pultrusion interconnection elements 12 that align with corresponding conductive portions of printed circuit boards mounted 31 and 32 on top of and below the dielectric interconnection substrate 10.

Thus, in accordance with the present invention, a interlevel connector structure is advanced in which specially configured pultruded distributed carbon fiber strands of the type including small diameter carbon or metalized carbon fibers perform the inter-board interconnect functions, for uses in such devices as printed circuit boards, molded wiring boards, flex-circuit interconnectors and the like, in which circuits on one surface of one substrate board must be reliably connected electrically to another substrate board, or to other external devices.

Figure 2:
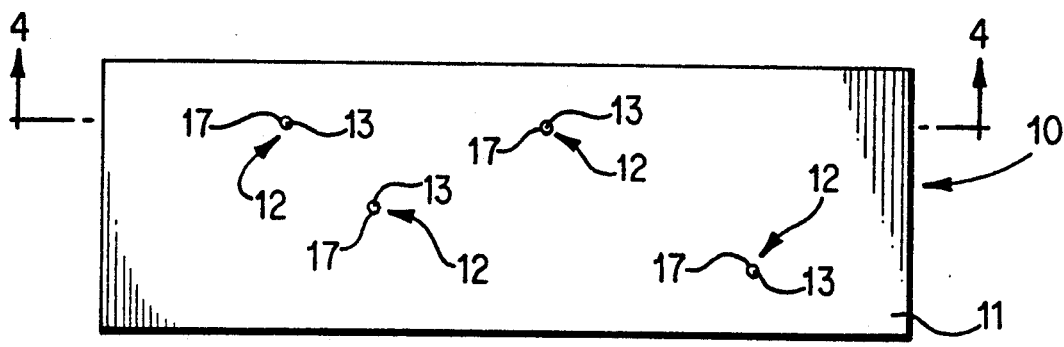
FIG. 2 is a top elevation view of the printed circuit board or dielectric substrate of FIG. 1.
Figure 3:
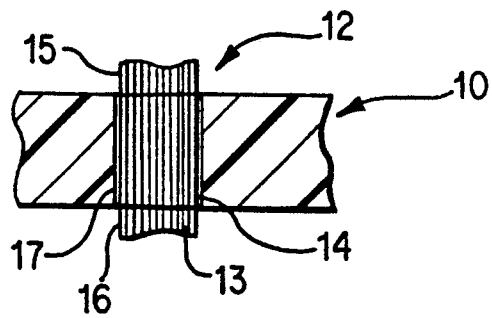

With reference now to FIGS. 1-3 of the drawing, a printed circuit or interlevel connector 10 is shown fabricated upon an insulating substrate 11 in which a plurality of continuous carbon fiber pultrusions 12, for example of 0.050 inch in diameter, are mounted and processed to form a conductive interconnect. The interlevel connector 10 may be positioned between a pair of printed circuit boards 31 and 32 mounted on the top and bottom surfaces of the dielectric substrate 10, as shown in FIG. 4. Thus, lengths of a continuous carbon fiber pultrusion are inserted in through holes 17 in the dielectric substrate 10, the lengths being cut so that top and bottom portions of the pultrusions 12 extend above the top surface and below the bottom surface of the dielectric substrate 10 a distance sufficient to enable interconnection to conductors 30 and 33 of respective adjacent printed circuit boards 31 and 32. After the pultrusions 12 have been located in the through holes 17, they are exposed to a laser beam to affix the pultrusions 12 within the through holes and to fibrillate the portions extending above the top surface and below the bottom surface to expose the fibers 13 by removal of the host material portion 14 of the pultrusions 12.

The pultrusions 12 are located in a through holes 17 in the dielectric substrate in a pattern that corresponds to the desired interconnection pattern to be established between the printed circuit boards 31 and 32. The methods of establishing such interconnection patterns and for forming the through holes in an intermediate or interlevel dielectric substrate are well known in the art and are not described in detail herein.

As mentioned, the pultrusion 12, in accordance with a preferred embodiment of the invention, can comprise continuous carbon fibers or strands 13 within a host polymer 14. Such pultrusions provide a convenient way to handle, process and use fine diameter, carbon fibers without the problems typically encountered with free conductive fibers, in contrast to previous interconnect techniques.

The process for making such pultrusions generally consists of pulling continuous lengths of fibers first through a resin bath or impregnator, then into a preforming fixture where the resulting section is at least partially shaped and excess resin and/or air are removed. The section is then pulled into heated dies where it is continuously cured. For a detailed discussion of pultrusion technology, reference is directed to "Handbook of Pultrusion Technology" by Raymond W. Meyer, first published in 1985 by Chapman and Hall, New York.

More specifically, conductive carbon fibers may be submersed in a polymer bath and drawn through a die opening of suitable shape at high temperature to produce a solid piece having dimensions and shapes of that of the die. The solid piece can then be cut, shaped, or machined. As a result, a structure can be achieved that has thousands of conductive fiber elements contained within the polymer matrix. The very large redundancy and availability of electrical contacts enables a substantial improvement in the reliability of these devices.

Since the plurality of small diameter conductive fibers are pulled through the polymer bath and heated die as a continuous length, the shaped member can be formed with the fibers being continuous from one end of the member to the other. Accordingly, the pultruded composite may be formed in a continuous length during the pultrusion process, then cut to suitable dimensions, with a very large number of potential electrical contacts provided at each end. The ends of the various contact members may then have its ends fibrillated.

Any suitable fiber having a high resistivity may be used in the practice of the invention. Typically, the conductive fibers are nonmetallic and have a DC volume resistivity of from about $1 \times 10^{-5}$ to about $1 \times 10^{10}$ ohm-cm and preferably from about $1 \times 10^{-4}$ to about 10 ohm-cm to minimize resistance losses and suppress RFI. The upper range of resistivities of up to $1 \times 10^{10}$ ohm-cm. could be used, for example, in those special applications involving extremely high fiber densities where the individual fibers act as individual resistors in parallel thereby lowering the overall resistance of the pultruded member enabling current conduction. The vast majority of applications however, will require fibers having resistivities within the above stated preferred range to enable current conduction. The term "nonmetallic" is used to distinguish from conventional metal fibers which exhibit metallic conductivity having resistivity of the order of $1 \times 10^{-6}$ ohm-cm and to define a class of fibers which are nonmetallic but can be treated in ways to approach or provide metal like properties. Higher resistivity materials may be used if the input impedance of the associated electronic circuit is sufficiently high. However, carbon fibers are particularly well suited as preferred filler because they are chemically and enviromentally inert, possess high strength and stiffness, can be tailored to virtually any desired resistivity, and exhibit a negative coefficient of thermal resistivity.

The individual conductive fibers 13 can be made of circular cross section shape shown, with a diameter in the order of from about 4 to about 50 micrometers, preferably from about 7 to 10 micrometers. This provides a very high degree of redundancy in a small cross sectional area. Thus, as contact materials, the fibers provide a multiple redundancy of contact points, for example, in the range between about $0.05 \times 10^5$ and $5 \times 10^5$ contacts/cm$^2$, preferably about 0.05580 contacts/cm$^2$. This is believed to enable ultrahigh contact reliability.

The fibers 13 are typically flexible and compatible with the polymer systems within which they are carried. Typical fibers may include carbon, carbon/graphite, metalized or metal coated carbon fibers and metal coated glass fibers. A particularly preferred class of fibers that may be used are those fibers that are obtained from controlled heat treatment processing to yield complete or partial carbonization of polyacrylonitrile (PAN) precursor fibers. It has been found for such fibers that by carefully controlling the temperature of carbonization within certain limits that precise electrical resistivities for the carbonized carbon fibers may be obtained. The carbon fibers from polyacrylonitrile (PAN) precursor fibers are commercially produced by the Stackpole Company, Celion Carbon Fibers, Inc., division of BASF and others in yarn bundles of 1,000 to 160,000 filaments. The yarn bundles are carbonized in a two-stage process. The first stage involves stabilizing the PAN fibers at temperatures of the order of 300° C. in an oxygen atmosphere to produce preox-stabilized PAN fibers. The second stage involves carbonization of the fibers at elevated temperatures in an inert atmosphere, such as an atmosphere containing nitrogen. The DC electrical resistivity of the resulting fibers is controlled by the selection of the temperature of carbonization. For example, carbon fibers having an electrical resistivity of from about $10^2$ to about $10^6$ ohms-cm are obtained if the carbonization temperature is controlled in the range of from about 500° C. to 750° C. while carbon fibers having D.C. resistivities of $10^{-2}$ to about $10^{-6}$ ohm-cm result from treatment temperatures of 1800° to 2000° C. For further reference to the processes that may be employed in making these carbonized fibers attention is directed to U.S. Pat. No. 4,761,709 to Ewing et al and the literature sources cited therein at column 8. Typically these carbon fibers have a modulus of from about 30 million to 60 million psi or 205–411 GPa which is higher than most steels thereby enabling a very strong pultruded composite member. The high temperature conversion of the polyacrylonitrile fibers results in a fiber which is about 99.99% elemental carbon which is inert and will resist oxidation.

One of the advantages of using conductive carbon fibers is that they have a negative coefficient of thermal conductivity so that as the individual fibers become hotter with the passage of, for example, a spurrious high current surge, they become more conductive. This provides an advantage over metal contacts since metals operate in just the opposite manner and therefore metal contacts tend to burn out or self destruct. The carbon fibers have the further advantage in that their surfaces are inherently rough and porous thereby providing better adhesion to the polymer matrix. In addition, the inertness of the carbon material yields a contact surface relatively immune to contaminants of the plated metal.

The carbon fibers 13 are enclosed in any suitable polymer matrix 14. The polymer matrix 14 should be of a resin binder material that will volatilize rapidly and cleanly upon direct exposure to the laser beam during laser processing below described. Polymers such as low molecular weight polyethylene, polypropylene, polystyrene, polyvinylchloride, and polyurethane may be particularly advantageously employed. Polyesters, epoxies, vinyl esters, polyetheretherketones, polyetherimides, polyethersulphones and nylon are in general, suitable materials with the polyesters and vinylesters being preferred due to their short cure time, relative chemical inertness and suitability for laser processing. If desired, in some applications, the host polymer can be appropriately doped to itself be conductive.

A laser (not shown) can be used to cut individual components for use as the interconnect elements 12, to affix the pultrusion segments within the through holes 17, and to fibrillate the end portions 15 and 16 on the top and bottom surfaces of the substrate 10, as shown. Optionally, one end of the pultrusion may be fibrillated and allowed to protrude above a surface of the substrate 10, while the other end may be soldered or otherwise connected or fastened to the circuity (not shown) which may be formed on the board. More particularly, a focused laser can be used to cut the pultrusion and simultaneously volatilize the binder resin in a controlled manner to produce in one step a distributed filament contact. The length of exposed carbon fiber can be controlled by the laser power and cut rate, and various tip shapes can be achieved by changing the laser incidence angle. Thus, a suitable pultrusion can be cut by laser techniques to form, for example, a top contact 15 (see FIG. 3) of desired length from the top surface of the substrate 10, with its ends fibrillated to provide a high redundancy fiber contact member to contact the conductive layers 30 of a printed circuit board 31 in contact therewith, and to form a bottom contact 16 of desired length from the bottom surface of the substrate 10, with its ends fibrillated to provide a high redundancy fiber contact member to contact the conductive layers 33 of a printed circuit board 32 in contact therewith.

Any suitable laser can be used which will be absorbed by the matrix of the host polymer 14, so that the host polymer 14 will be volatilized. Specific lasers which may be used include a carbon dioxide laser, the Nd YAG laser, or the argon ion laser. The carbon dioxide laser mentioned is particularly suited for this application, however, since it is the most reliable, best suited for polymer matrix absorption, and is most economical in manufacturing environments.

In use, the interlevel connector 10 in which the pultrusion segments 12 with fibrillated ends 13 have been mounted in the desired interconnection pattern is placed between the printed circuit or wiring boards 31 and 32 to be interconnected. The fibrillated pultrusion ends contact the respective conductors of the printed circuit boards 31 and 32, thereby establishing the desired electrical interconnection. If desired, the printed circuit boards 31 and 32 can be permanently affixed in the layered, sandwich configuration by temperature or pressure techniques, known in the art. Alternatively, the sandwich configuration can be temporarily fixed by appropriate fasteners, such as screws and bolts, or the like, for example, for ease of separation and replacement of one of the boards. The temporary connection capability enabled by the structure of this invention is of particular advantage, for example, in allowing field repairs or bench testing to be easily and rapidly per-formed by substitution of one printed circuit or wiring board for another. This is also of advantage in circuit development procedures in which one wiring board can be easily substituted for another without requiring expensive and time consuming multilayer printed circuit board fabrications.

Additionally, although the invention has been described hereinabove with reference to printed circuit or wiring boards, such wiring interconnections can easily be provided as a part of a machine structure. More particularly, for example, one of the wiring boards, such as the lower printed wiring board 32 shown in FIG. 4, can be a substrate manufactured from an electrically insulating polymer matrix which is doped with an electrically insulating fibrous filler capable of heat conversion to an electrically conductive fibrous filler to form the conductive portion to be interconnected. Such a substrate can be easily fabricated as a wall or other machine structure, and interconnected to a desired printed circuit or wiring board utilizing the interlevel connector 10 in a manner similar to that described above with respect to the interconnection of two printed circuit or wiring boards.

One technique by which the substrate having desired electrically conducting paths may be formed is to load or dope an electrically insulating polymer matrix that will provide the substrate to which connection will be made with a suitable polymeric fibrous material capable of heat conversion to conductive fibrous carbon within the polymer matrix. Examples of suitable fibrous filler are cellulose (rayon), petroleum pitch based carbon fibers which are heat convertible carbonaceous fibers, and thermally stabilized, polyacrylonitrile fibers. The fiber filed polymer matrix doped with such fibers may be formed into the hinge assemblies by conventional or injection molding or extruding techniques.

The selective heating required to convert the electrically insulating fibrous filler to an electrically conductive filler in the desired areas can be carried out in any suitable manner. Again, preferably, a laser, such as a carbon dioxide laser, may be used to direct the laser beam to the selected portions of the polymer matrix to be pyrolyzed by melting the polymer and heat converting the electrically insulating fibers to electrically conductive fibers to form the conductive path.

Thus, utilizing the above described conductor forming techniques, power, high voltage and/or logic signal paths can be provided in a wall or other machine structure, and control or signal processing circuitry can be provided on a separate printed circuit board. Utilizing an interlevel connector, of the type described hereinabove, the control or signal processing circuitry can be easily temporarily or permanently connected to the machine circuitry, thereby reducing machine fabrication time and complexity, while increasing its reliability.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A multilayer wiring assembly, comprising:
   first and second wiring boards having respective conductive portions to be interconnected;
   a dielectric substrate having top and bottom surfaces adjacent to which said first and second wiring boards are locatable, and having through holes at locations corresponding to locations of said conductive portions of said first and second wiring boards to be interconnected; and
   a plurality of interlevel connectors, each said interlevel connector being located in a respective through hole, for connecting said conductive portions of said first and second wiring boards, each said interlevel connector comprising:
   a composite pultruded member having a first and second end, said first end extending above the top surface of said dielectric substrate and said second end extending below the bottom surface of said dielectric substrate;
   said composite pultruded member including a plurality of electrically conductive fibers embedded in a host material, said fibers being continuous from said first end to said second end of said composite pultruded member; and
   said first and second ends being fibrillated to form a densely distributed brush-like structure for providing conductive dense filament contact with said first and second conductive portions of said first and second wiring boards to be interconnected when said first and second wiring boards are located adjacent to said dielectric substrate.

2. The multilayer wiring assembly of claim 1 wherein said host material comprises a conductive material.

3. The multilayer wiring assembly of claim 1 wherein said host material comprises an insulating material.

4. The multilayer wiring assembly of claim 3 wherein said insulating material comprises an organic compound.

5. The multilayer wiring assembly of claim 4 wherein said organic compound is a polyimide composition.

6. The multilayer wiring assembly of claim 1 wherein said host material comprises a material which will volatilize rapidly and cleanly upon direct exposure to a laser beam of predetermined energy.

7. The multilayer wiring assembly of claim 6 wherein said host polymer comprises a polymer selected from the group consisting of low molecular weight polyethylene, polypropylene, polystyrene, polyvinylchloride, and polyurethane.

8. The multilayer wiring assembly of claim 1 wherein said electrically conductive fibers are carbon fibers.

9. The multilayer wiring assembly of claim 1 wherein said pultrusions are of circular cross sectional shape.

10. The multilayer wiring assembly of claim 1 wherein at least one of said wiring boards is a printed circuit board.

11. The multilayer wiring assembly of claim 1 wherein at least one of said wiring boards is a printed wiring board.

12. The multilayer wiring board of claim 1 wherein at least one of said wiring boards is removably locatable adjacent said dielectric substrate.

13. The multilayer wiring assembly of claim 1 wherein at least one of said wiring boards comprises a substrate of an electrically insulating polymer matrix doped with an electrically insulating fibrous filler being heat converted to an electrically conductive fibrous filler to form the conductive portion to be interconnected.

14. A connector for interconnecting conductors of a conductor carrying substrate to conductors of a device, comprising:

a dielectric substrate having a first surface for placement adjacent said conductor carrying substrate and a second surface for placement adjacent said device, and having a plurality of through holes; and a plurality of connectors, each said connector being located in a respective through hole, for connecting said conductors of said conductor carrying substrate to said conductors of said device, each said connector comprising:

a composite pultruded member having a first and second end, said first end extending beyond the first surface of said dielectric substrate, said second end extending beyond the second surface of said dielectric substrate;

said composite pultruded member including a plurality of electrically conductive fibers embedded in a host material, said fibers being continuous from said first end to said second end of said composite pultruded member; and said first and second ends being fibrillated to form a densely distributed brush-like structure for providing conductive dense filament contact with the conductors of said conductor carrying substrate and the conductors of said device.

15. The connector of claim 14 wherein said host material comprises an electrically conductive material.

16. The connector of claim 14 wherein said host material comprises an insulating material.

17. The connector of claim 14 wherein said host material comprises a polymer which will volatilize rapidly and cleanly upon direct exposure to a laser beam of predetermined energy.

18. The connector of claim 14 wherein said insulating host material comprises an organic compound.

19. The connector of claim 18 wherein said organic compound is a polymer.

20. The connector of claim 19 wherein said polymer is a polyimide composition.

21. The connector of claim 19 wherein said polymer is a polymer selected from the group consisting of low molecular weight polyethylene, polypropylene, polystyrene, polyvinylchloride, and polyurethane.

22. The connector of claim 14 wherein said conductor carrying substrate is a printed circuit board.

23. The connector of claim 14 wherein said conductor carrying substrate is a printed wiring board.

24. The connector of claim 14 wherein said conductor carrying substrate is removably locatable adjacent said dielectric substrate.

25. The connector of claim 14 wherein said conductor carrying substrate is a substrate having an electrically insulating polymer matrix doped with an electrically insulating fibrous filler being heat converted to an electrically conductive fibrous filler to form the conductors to be interconnected.

26. The connector of claim 14 wherein said fibers are carbon fibers.

27. The connector of claim 14 wherein said pultrusions are of circular cross sectional shape.

28. A multilayer wiring board, comprising:

first and second wiring boards having respective conductive portions;

a dielectric substrate having top and bottom surfaces to which said first and second wiring boards are affixed, and having through holes at locations corresponding to locations of said conductive portions of said first and second wiring boards to be interconnected; and a plurality of interconnectors, each said interconnector being located in a respective through hole, for connecting the conductive portions of said first and second wiring boards, each said interconnector comprising:

a composite pultruded member having a first and second end, said first end extending above the top surface of said dielectric substrate and said second end extending below the bottom surface of said dielectric substrate;

said composite pultruded member including a plurality of electrically conductive fibers embedded in a host material, said fibers being continuous from said first end to said second end of said composite pultruded member; and said first and second ends being fibrillated to form a densely distributed brush-like structure for providing conductive dense filament contact with said conductive portions of said first and second wiring boards to be connected.

29. The multilayer wiring board of claim 28 wherein said host material comprises an electrically conducting material.

30. The multilayer wiring board of claim 28 wherein said host material comprises an electrically insulating material.

31. The multilayer wiring board of claim 28 wherein said insulating component comprises an organic compound.

32. The multilayer wiring board of claim 31 wherein said organic compound is a polyimide composition.

33. The multilayer wiring board of claim 28 wherein said host material volatilizes rapidly and cleanly upon direct exposure to a laser beam of predetermined energy.

34. The multilayer wiring board of claim 28 wherein said host polymer comprises a polymer selected from the group consisting of low molecular weight polyethylene, polypropylene, polystyrene, polyvinylchloride, and polyurethane.

35. The multilayer wiring board structure of claim 28 wherein said electrically conductive fibers are carbon fibers.

36. The multilayer wiring board of claim 28 wherein said pultrusions are of circular cross sectional shape.

37. An interlevel connector, comprising:

a dielectric substrate having a plurality through holes; and a plurality of interlevel connectors, each said interlevel connector being located in a respective through hole, each said interlevel connector comprising:

a composite pultruded member having a first and second end;

said composite pultruded member including a plurality of electrically conductive fibers embedded in a host material, said fibers being continuous from the first end to the second end of said composite pultruded member; and said first and second ends being fibrillated to form a densely distributed brush-like structure for providing conductive dense filament connection.

38. The interlevel connector of claim 37 wherein said host material comprises an electrical conducting material.

39. The interlevel connector of claim 37 wherein said host material comprises an electrically insulating material.

40. The interlevel connector structure of claim 39 wherein said insulating component comprises an organic compound.

41. The interlevel connector structure of claim 40 wherein said organic compound is a polyimide composition.

42. The interlevel connector structure of claim 37 wherein said host material volatilizes rapidly and cleanly upon direct exposure to a laser beam of predetermined energy.

43. The interlevel connector structure of claim 37 wherein said host polymer comprises a polymer selected from the group consisting of low molecular weight polyethylene, polypropylene, polystyrene, polyvinylchloride, and polyurethane.

44. The interlevel connector structure of claim 37 wherein said electrically conductive fibers are carbon fibers.

45. The interlevel connector of claim 37 wherein said pultrusions are of circular cross sectional shape.

* * * * *